(12) United States Patent
Klaus et al.

(10) Patent No.: US 7,816,218 B2
(45) Date of Patent: Oct. 19, 2010

(54) SELECTIVE DEPOSITION OF AMORPHOUS SILICON FILMS ON METAL GATES

(75) Inventors: Jason Klaus, Portland, OR (US); Sean King, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 12/228,615

(22) Filed: Aug. 14, 2008

(65) Prior Publication Data

US 2010/0038687 A1 Feb. 18, 2010

(51) Int. Cl.
*H01L 21/00* (2006.01)

(52) U.S. Cl. .................. 438/301; 438/446; 438/448; 438/649; 438/721; 438/744; 257/E21.165; 257/E21.438; 257/E21.507; 257/E21.552; 257/E29.127

(58) Field of Classification Search ......... 438/301–304, 438/446–448, 649–669, 696–721, 744; 257/E21.165, 257/258, 438, 507, 552, 29.127

See application file for complete search history.

(56) References Cited

U.S. PATENT DOCUMENTS

| 4,873,204 | A | * | 10/1989 | Wong et al. | ............. 438/649 |
|---|---|---|---|---|---|
| 5,629,230 | A | * | 5/1997 | Fazan et al. | ............. 438/446 |
| 6,242,354 | B1 | * | 6/2001 | Thomas | ............. 438/696 |
| 7,078,282 | B2 | | 7/2006 | Chau et al. | |
| 2005/0151203 | A1 | * | 7/2005 | Cho et al. | ............. 257/371 |
| 2007/0254442 | A1 | * | 11/2007 | Manger et al. | ............. 438/304 |
| 2008/0116481 | A1 | | 5/2008 | Sharma et al. | |
| 2008/0160709 | A1 | * | 7/2008 | Chen et al. | ............. 438/301 |
| 2008/0258245 | A1 | * | 10/2008 | Forbes et al. | ............. 257/412 |

* cited by examiner

*Primary Examiner*—Michael S Lebentritt
(74) *Attorney, Agent, or Firm*—John N. Greaves

(57) ABSTRACT

A microelectronic device includes a metal gate with a metal gate upper surface. The metal gate is disposed in an interlayer dielectric first layer. The interlayer dielectric first layer also has an upper surface that is coplanar with the metal gate upper surface. A dielectric etch stop layer is disposed on the metal gate upper surface but not on the interlayer dielectric first layer upper surface.

25 Claims, 9 Drawing Sheets

SELECTIVE DEPOSITION OF AMORPHOUS SILICON FILMS ON METAL GATES

TECHNICAL FIELD

Disclosed embodiments relate to semiconductive devices and processes of making them.

BACKGROUND

The sizes of the microelectronic devices and other active and passive electrical components continuously scale down in attempts to increase device integrated-circuit density. Electrical contacts are fabricated to provide an electrical access to the microelectronic devices built on a wafer. Typically, lithography techniques are used to define the location of contact vias to the devices. As the size of the microelectronic devices and spacing between are scaled down, process challenges may increase.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may show only the structures necessary to understand the illustrated embodiments. Additional structures known in the art may have not been included to maintain the clarity of the drawings.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1:
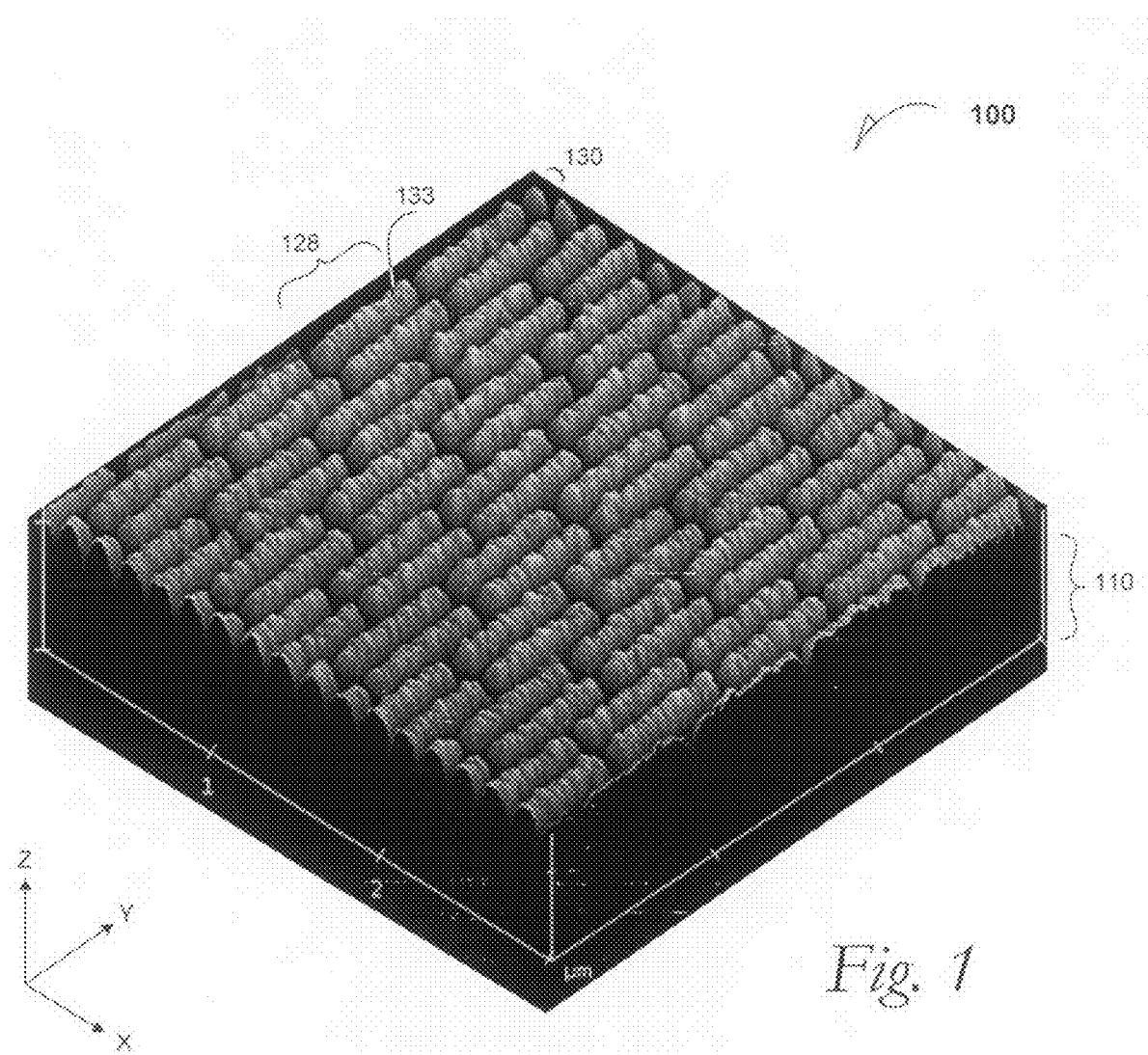
FIG. 1 is a computer rendering from a photomicrograph of an array of selectively deposited amorphous silicon upon a semiconductive body during processing according to an example embodiment.

FIG. 1 is a computer rendering from a photomicrograph 100 of an array of selectively deposited amorphous silicon upon a semiconductive substrate during processing according to an example embodiment. A semiconductive body 110 is illustrated. Upon the semiconductive body 110 is deposited an array of amorphous silicon that has been selectively deposited upon exposed upper surfaces of metal gates. A given selectively deposited body of amorphous silicon 132 is depicted to illustrate a metal gate length 128 and a metal gate width 130. The selectively deposited body of amorphous silicon 132 shows definition between itself and other occurrences of selectively deposited bodies of amorphous silicon.

Figure 2:
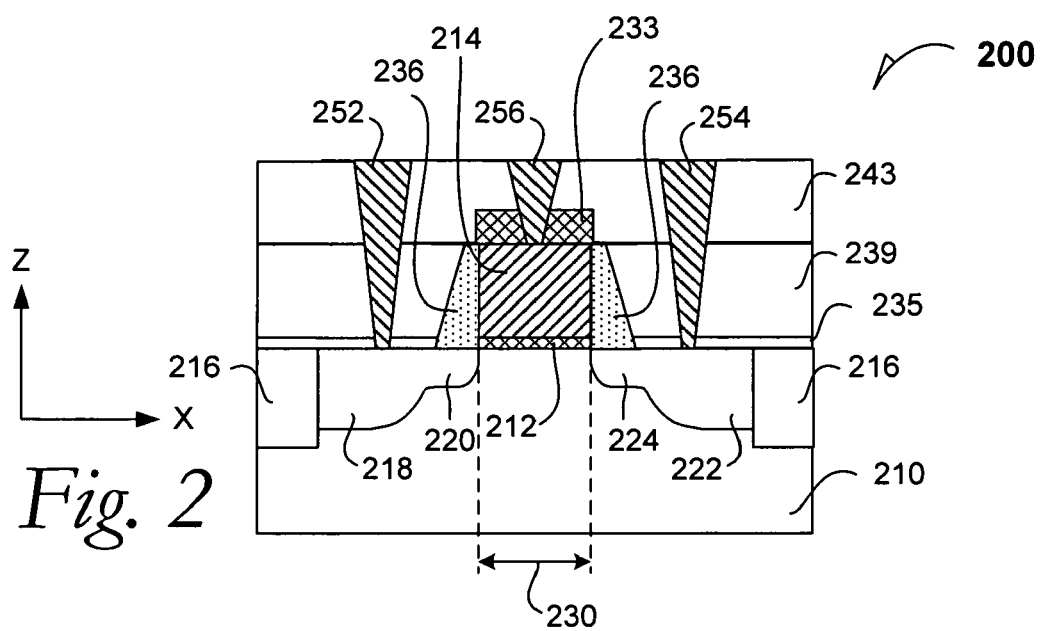
FIG. 2 is a cross-section elevation of a microelectronic device with a selectively deposited and converted amorphous silicon etch stop layer above a metal gate according to an embodiment.

FIG. 2 is a cross-section elevation of a microelectronic device 200 with a selectively deposited and converted amorphous silicon etch stop layer 233 above a metal gate according to an embodiment. As depicted, the microelectronic device 200 illustrates a transistor. The transistor includes a semiconductive body 210 with a gate dielectric 212 disposed upon an upper surface thereof. A gate electrode 214 is disposed on the gate dielectric 212. In an embodiment, the semiconductive body 210 may include any semiconductor material to make a variety of integrated circuits including passive, and active devices. In an embodiment, the semiconductive body 210 includes a monocrystalline silicon structure. In an embodiment, the semiconductive body 210 includes a silicon-on-insulator (SOI) structure. In an embodiment, the semiconductive body 210 is a fin-shaped prominence that extends in the Z-direction away from a larger substrate of semiconductive material. Other embodiments for semiconductive material for the semiconductive body 210 may use combined semiconductors, for example, indium phosphide, gallium arsenide, gallium nitride, silicon germanium, and silicon carbide.

In an embodiment, the semiconductive body 210 comprises any material, e.g., SOI, gallium arsenide (GaAs), germanium (Ge), or SiGe. In an embodiment, the transistor is coupled to one or more metallization layers of integrated circuits having active and passive devices, such as transistors, switches, optoelectronic devices, capacitors, resistors, and interconnects. The one or more metallization layers of integrated circuits are separated from adjacent metallization layers by dielectric material such as interlayer dielectric layers (ILD).

In an embodiment, the transistor is isolated by structures such as a shallow trench isolation (STI) 216.

In an embodiment, the gate dielectric 212 includes silicon dioxide ($SiO_2$). In an embodiment, the gate dielectric includes silicon oxynitride ($SiO_xN_y$). In an embodiment, the gate dielectric 212 includes silicon nitride ($Si_3N_4$). In an embodiment, the gate dielectric 212 includes any two of the above given gate dielectrics.

In an embodiment, the gate dielectric 212 includes an oxide of a metal that has a dielectric constant k higher than the dielectric constant of $SiO_2$. Examples for such oxides may include zirconium oxide ($ZrO_2$), hafnium oxide ($HFO_2$), and lanthanum oxide ($La_2O_4$). The gate dielectric 212 may be formed using any conventional technique that is known to one of ordinary skill in the art of microelectronic device manufacturing, for example, using any suitable spinning-on, chemical vapor deposition (CVD), or physical vapor deposition (PVD, also known as sputtering) technique.

The gate electrode 214 is formed on the gate dielectric 212 and may be a metal gate such as copper (Cu). In an embodiment, the gate electrode 214 is ruthenium (Ru). In an embodiment, the gate electrode 214 is nickel (Ni). In an embodiment, the gate electrode 214 is cobalt (Co). In an embodiment, the gate electrode 214 is chromium (Cr). In an embodiment, the gate electrode 214 is iron (Fe). In an embodiment, the gate electrode 214 is manganese (Mn). In an embodiment, the gate electrode 214 is titanium (Ti). In an embodiment, the gate electrode 214 is aluminum (Al). In an embodiment, the gate electrode 214 is hafnium (Hf). In an embodiment, the gate electrode 214 is tantalum (Ta). In an embodiment, the gate electrode 214 is tungsten (W). In an embodiment, the gate electrode 214 is vanadium (V). In an embodiment, the gate electrode 214 is molybdenum (Mo). In an embodiment, the gate electrode 214 is palladium (Pd). In an embodiment, the gate electrode 214 is gold (Au). In an embodiment, the gate electrode 214 is silver (Ag). In an embodiment, the gate electrode 214 is platinum (Pt). In an embodiment, the gate electrode 214 is any combination of the given metals.

FIG. 2 also illustrates the transistor with a source region 218 that includes a shallow source extension region (tip) 220 embodiment and a drain region 222 that includes a shallow drain tip 224 embodiment that are formed at the opposite sides of the gate electrode 214. In an embodiment, the width 230 of the channel zone under the gate dielectric 212 between the tip 220 embodiment and the tip 224 embodiment is in the range of 9 nanometers (nm) to 120 nm. This width 230 may be mapped to the gate width 130 depicted in the computer rendering from the photomicrograph 100 depicted in FIG. 1.

In an embodiment, the source region 218 and the drain region 222 may be formed using one of techniques known to one of ordinary skill in the art of microelectronic device manufacturing. In an embodiment, dopants are first implanted into the semiconductive body 210 at the opposite sides of the gate electrode 214 to form the respective tips 220 and 224. As a result the gate electrode 214 serves as a hard mask to prevent implantation of dopants into the portions of the semiconductive body 210 below the gate dielectric 212 that defines the channel zone of the transistor. In an embodiment, to form an n-MOS transistor, the dopants are n-type dopants, for example, arsenic ions or phosphorus ions with the concentration in the range of $10^{18}$ $cm^{-3}$ to $10^{21}$ $cm^{-3}$. In an embodiment, to form a p-MOS transistor structure, the dopants are p-type dopants, for example, boron ions having the concentration in the range of $10^{18}$ $cm^{-3}$ to $10^{<}cm^{-3}$.

A nitride etch-stop layer (NESL) 235 is disposed across the upper surface of the semiconductive body 210. It may now be understood that the NESL 235 may be substituted with another dielectric material that may act as an etch-stop layer. Spacers 236 are formed on the semiconductive body 210 adjacent to sidewalls of the gate electrode 214. In an embodiment, the spacers 236 cover sidewalls of the gate electrode 214 and part of the upper surface of the semiconductive body 210 at opposite sides of the gate electrode 214.

In an embodiment, the spacers 236 are an oxide material. In an embodiment, the spacers 236 are a nitride material. In an embodiment, the spacers 236 are a combination such as an oxynitride material. In an embodiment, the spacers 236 include silicon nitride. In an embodiment, the spacers 236 include silicon carbide. In an embodiment, the spacers 236 include silicon boron nitride. In an embodiment any two of the above silicon-based materials may be combined to form the spacers 236. In an embodiment all three of the above silicon-based materials may be combined to form the spacers 236.

Formation of the spacers 236 can be done by conventional techniques that are known to one of ordinary skill in the art of microelectronic device manufacturing. The spacers 236 may be used to protect the gate electrode 214 from shorting to source and/or drain metal contacts during processing. In an embodiment, the spacers 236 and the gate electrode 214 serve as a mask to prevent implantation of the dopants into the regions of the semiconductive body 210 below the spacers 236 and below the gate electrode 214.

The gate electrode 214 is depicted disposed within an interlayer dielectric (ILD) first layer 239, and an ILD cap layer 243 is disposed above the ILD first layer 239. A source contact 252 and a drain contact 254 make contact with the upper surface of the semiconductive body 210 by penetrating the ILD first layer 239, the ILD cap layer 243, and the NESL 235.

A gate contact 256 is disposed in the ILD cap layer 243 and it penetrates the ILD cap layer 243 and the converted amorphous silicon layer 233.

Figure 2A:
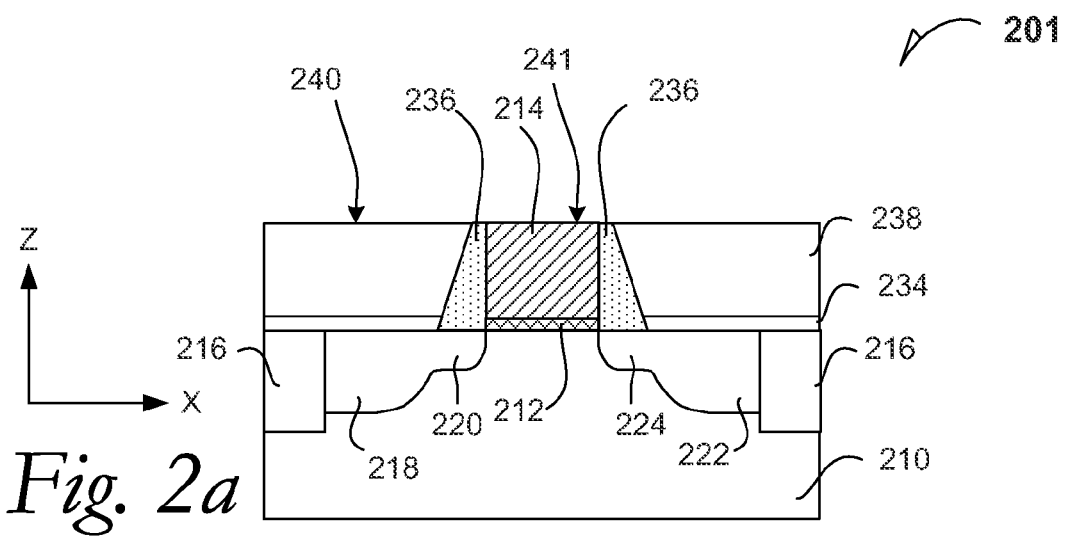
FIG. 2a is a cross-section elevation of the microelectronic device depicted in FIG. 2 during processing according to an embodiment.

FIG. 2a is a cross-section elevation of the microelectronic device depicted in FIG. 2 during processing according to an embodiment. The microelectronic device 201 has been processed to a level that the gate electrode 214, the spacers 236, and the ILD first layer 238 have been polished to form an upper surface 240. Processing after this manner leaves exposed metal of the gate electrode 214 in comparison to exposed dielectrics of the spacers 236 and the ILD first layer 238. Consequently, the upper surface 240 is a substantially coplanar upper surface of the ILD first layer 238 and the upper surface 241 of the gate electrode 214. The ILD first layer 238 depicted in FIG. 2a is the ILD first layer 239 depicted in FIG. 2 before a penetrating etch. The NESL 234 depicted in FIG. 2a is the NESL 235 depicted in FIG. 2 before a penetrating etch.

Figure 2B:
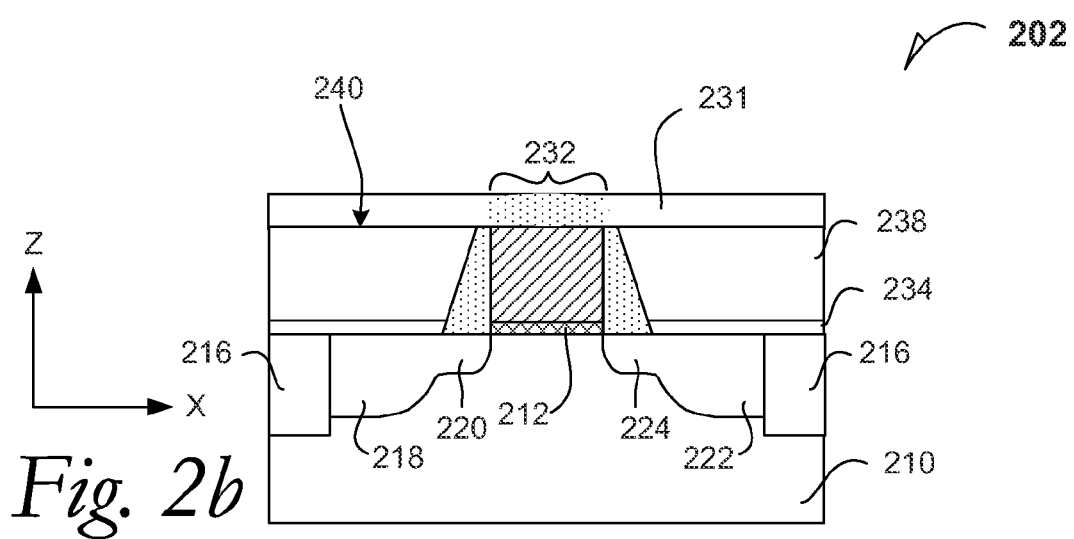
FIG. 2b is a cross-section elevation of the microelectronic device depicted in FIG. 2a after further processing according to an embodiment.

FIG. 2b is a cross-section elevation of the microelectronic device depicted in FIG. 2b after further processing according to an embodiment. The microelectronic device 202 has been blanket deposited with an amorphous silicon layer 231. Interaction between the amorphous silicon layer 231 and the metal of the gate electrode 214, however, has created an amorphous silicon layer 232 within the amorphous silicon layer 231. One may refer to this process result as "partially selective deposition".

In an embodiment, an amorphous silicon 232 is formed by chemical vapor deposition (CVD) of a silicon precursor to achieve the partially selective deposition, followed by an etch-back process to isolate the amorphous silicon 232 and remove the original amorphous silicon layer 231. In an embodiment, a silicon-containing chemical compound, such as but not limited to silane ($SiH_4$) is used to deposit the amorphous silicon. In an embodiment, disilane ($Si_2H_6$) can be used to deposit the amorphous silicon. In an example embodiment, the substrate is exposed to the Si containing precursor, for example silane ($SiH_4$), at a temperature of 200-800 degrees Celsius, and at a pressure of 0.1-10 Torr.

In an embodiment, a plasma-enhanced CVD (PECVD) process is used to achieve the partially selective deposition, followed by an etch-back process to isolate the amorphous silicon 232 from the original amorphous silicon layer 231. In an embodiment, a partially selective PECVD process was used to achieve an approximate 600 Angstrom (Å) thick amorphous silicon layer 231. After an etch-back process the structure depicted in FIG. 1 was achieved and photographed. In an embodiment of the present invention, a precursor that contains a silicon-containing chemical compound, such as but not limited to silane ($SiH_4$) or disilane ($Si_2H_6$) can be used for PECVD a-Si growth. In an example embodiment, the semiconductive body 210 is exposed to the Si containing precursor, for example silane ($SiH_4$), at a temperature of 250-400 degrees Celsius, at a pressure of 1-10 Torr and for a time duration of 1-30 seconds with radio frequency (RF) power of 10-3000 Watts. In an embodiment, an inert gas such as but not limited to hydrogen ($H_2$) can be used in addition to silane ($SiH_4$) or disilane ($Si_2H_6$). For example, a mixture of silane and hydrogen ($SiH_4+H_2$) or a mixture of disilane and hydrogen ($Si_2H_6+H_2$) can be used as reactants. Next, the entire substrate is exposed to the second precursor to remove the plurality of amorphous semiconductor from the dielectric surfaces (spacer and ILD). In one embodiment, the second precursor is an etchant gas, such as but not limited to hydrogen ($H_2$) or helium (He). In one embodiment, the first precursor is removed from the semiconductive body 210 before exposing the second precursor to the semiconductive body 210, so that only the second precursor reacts with the plurality of amorphous semiconductor deposits. In the case where the first precursor comprises silane ($SiH_4$) only, the flow of the first precursor to the semiconductive body 210 is stopped before allowing the second precursor, for example hydrogen ($H_2$), to flow to the semiconductive body 210. On the other hand, if the first precursor comprises a mixture of silane and hydrogen ($SiH_4+H_2$), then the flow of silane ($SiH_4$) to the semiconductive body 210 is stopped while the hydrogen (now acting as the second precursor) continues to flow to the semiconductive body 210. In a specific embodiment, the semiconductive body 210 is exposed to the second precursor, for example hydrogen ($H_2$), at a temperature of 200-450 degrees Celsius, at a pressure of 0.1-10 Torr and at a time duration of 5-300 seconds.

The second precursor is able to easily remove the plurality of amorphous semiconductor deposits from the adjoining dielectric layers and spacers due to the weak chemical bonding between the nuclei of each amorphous semiconductor deposit and the dielectric layers and spacers. In particular, the second precursor reacts with the plurality of amorphous semiconductor deposits and converts the plurality of amorphous semiconductor deposits into a gas phase, thus removing the plurality of amorphous semiconductor deposits from the dielectric layers and spacers. On the other hand, the nuclei of amorphous semiconductor layers have a strong chemical bond with the metal gate regions. Due to the strong chemical bonds, the second precursor only removes a portion of the amorphous semiconductor layers that were deposited on the gate region (differential etch rate between the amorphous silicon deposited on the gate as opposed to the surrounding dielectric regions). The thickness of the amorphous semiconductor layers deposited during the amorphous silicon deposition step and the duration of exposing the second precursor to the semiconductive body 210 can be controlled so as to effectively remove the plurality of amorphous semiconductor deposits and yet maintain sufficient thickness for the amorphous semiconductor layer on the gate regions.

In an embodiment, the metal lattice of the gate electrode 214 causes the amorphous silicon 232 to have a different atomic or molecular packing such that during an etch process, the etch recipe is selective to removing the amorphous silicon layer 231 and leaving behind the amorphous silicon 232. Other mechanisms may better explain the partially selective deposition phenomenon, followed by the etch back result.

Figure 2C:
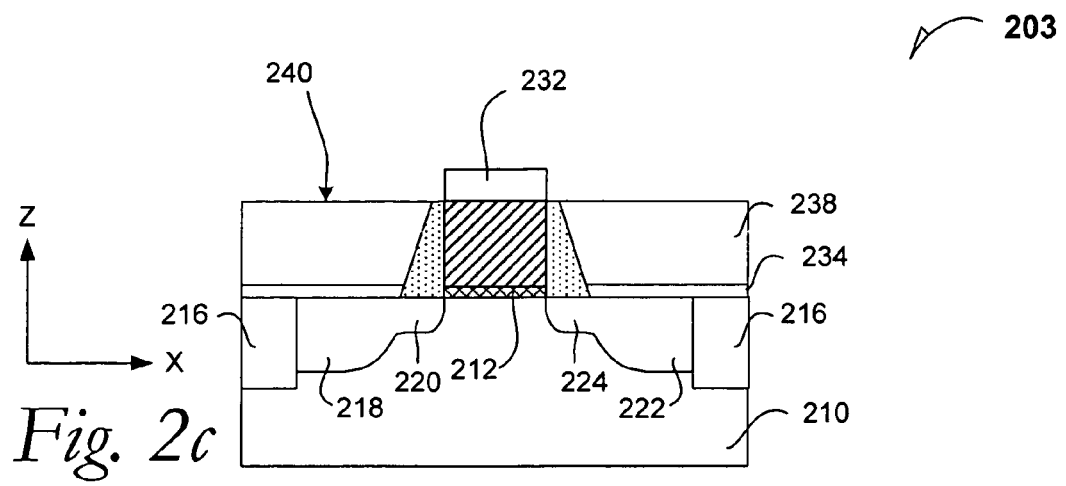
FIG. 2c is a cross-section elevation of the microelectronic device depicted in FIG. 2b after further processing according to an embodiment.

FIG. 2c is a cross-section elevation of the microelectronic device depicted in FIG. 2b after further processing according to an embodiment.

The microelectronic device 202 depicted in FIG. 2b has been processed to achieve the microelectronic device 203 depicted in FIG. 2c. In an embodiment, a blanket etch has been carried out on the microelectronic device 202 depicted in FIG. 2b, and the etch has been selective to leaving behind the amorphous silicon 232 that was in contact with the metal of the gate electrode 214.

In an embodiment, FIG. 2c is a cross-section elevation of the microelectronic device depicted in FIG. 2a, where a deposition of the amorphous silicon 232 has been achieved only upon the metal of the gate electrode 214. One may refer to this process result as "selective deposition". In this embodiment, a selective deposition of the amorphous silicon 232 has used the metal of the gate electrode 214 as a catalyst to cause deposition of the amorphous silicon 232 onto the metal before any deposition thereof, if at all, onto the dielectric of the spacer 236 and the first ILD 238. Other mechanisms may better explain the selective deposition phenomena.

In an embodiment, a CVD process is used with a silicon precursor to achieve the selective deposition of the amorphous silicon 232 onto the gate electrode 214 but not onto the upper surface of the ILD first layer 238. A silicon-containing chemical compound, such as but not limited to silane (SiH4) or disilane (Si2H6) can be used to deposit the amorphous silicon. In an embodiment, the substrate is exposed to the Si containing precursor, for example silane (SiH4), at a temperature of 200-800 degrees Celsius, at a pressure of 0.1-10 Torr. In an embodiment, a PECVD process is used with a silicon precursor to achieve the selective deposition of the amorphous silicon 232 onto the gate electrode 214 but not onto the upper surface of the ILD first layer 238. In an embodiment of the present invention, a precursor that contains a silicon-containing chemical compound, such as but not limited to silane (SiH4) or disilane (Si2H6) can be used for PECVD a-Si growth. In a specific embodiment, the semiconductive body 210 is exposed to the Si containing precursor, for example silane (SiH4), at a temperature of 250-400 degrees Celsius, at a pressure of 1-10 Torr and for a time duration of 1-30 seconds with RF power of 10-3000 Watts. In all of these deposition embodiments, it is understood that the disclosed processes are carried out under conditions to make the amorphous silicon 232 more likely to remain on the gate electrode 214 than for any amorphous silicon layer to remain on the ILD first layer 238 or the spacers 236. Further in all of the deposition embodiments, one may refer to the process as getting the amorphous silicon to accumulate on the metal gate 214 upper surface and not on the ILD first layer 238 upper surface. The accumulation may be achieved with or without an etch back process as described.

Figure 2D:
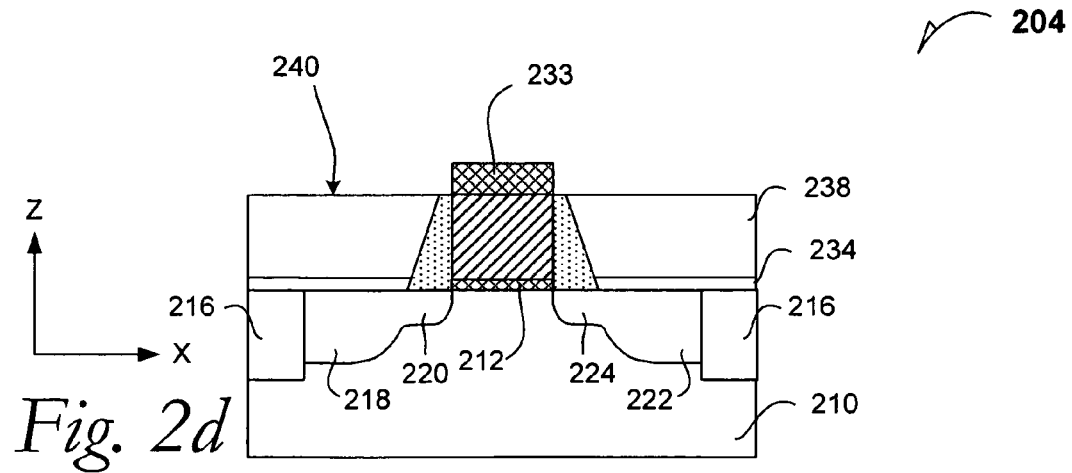
FIG. 2d is a cross-section elevation of the microelectronic device depicted in FIG. 2c after further processing according to an embodiment.

FIG. 2d is a cross-section elevation of the microelectronic device depicted in FIG. 2c after further processing according to an embodiment. The microelectronic device 204 has been processed to convert the amorphous silicon 232 into a more etch-stop capable material. In an embodiment, however, the amorphous silicon 232 may be a sufficient etch stop material that no conversion is needed, depending upon the specific application.

In an embodiment, the amorphous silicon 232 is converted into a dielectric material and is referred to as a converted amorphous silicon etch stop layer 233. Conversion of the amorphous silicon 232 is carried out by a plasma nitridation in the presence of ammonia to cause the converted amorphous silicon etch stop layer 233 to be a silicon nitride material according to an embodiment. Conversion of the amorphous silicon 232 is carried out by a plasma oxidation in the presence of oxygen to cause the converted amorphous silicon etch stop layer 233 to be a silicon oxide material according to an embodiment. In an embodiment, conversion of the amorphous silicon 232 is carried out by a plasma carbonization in the presence of methane to cause the converted amorphous silicon etch stop layer 233 to be a silicon carbide material. In an embodiment, plasma conversion of the amorphous silicon 232 is carried out by a plasma process that uses any two or all three of the nitride, oxide, or carbide materials or the like to achieve the converted amorphous silicon etch stop layer 233.

In an embodiment, the amorphous silicon 232 is partially selectively deposited or selectively deposited and it is used as a placeholder. The amorphous silicon 232 is capped with a dielectric layer (not pictured) and an etch back is done to expose the amorphous silicon 232 through the dielectric layer. Thereafter, the amorphous silicon 232 is wet-etch removed and a replacement dielectric 233 is filled into the recesses left by the wet etch.

Further processing is depicted herein and in correspondence with FIGS. 2e, 2f, 2g, and 2h.

Figure 2E:
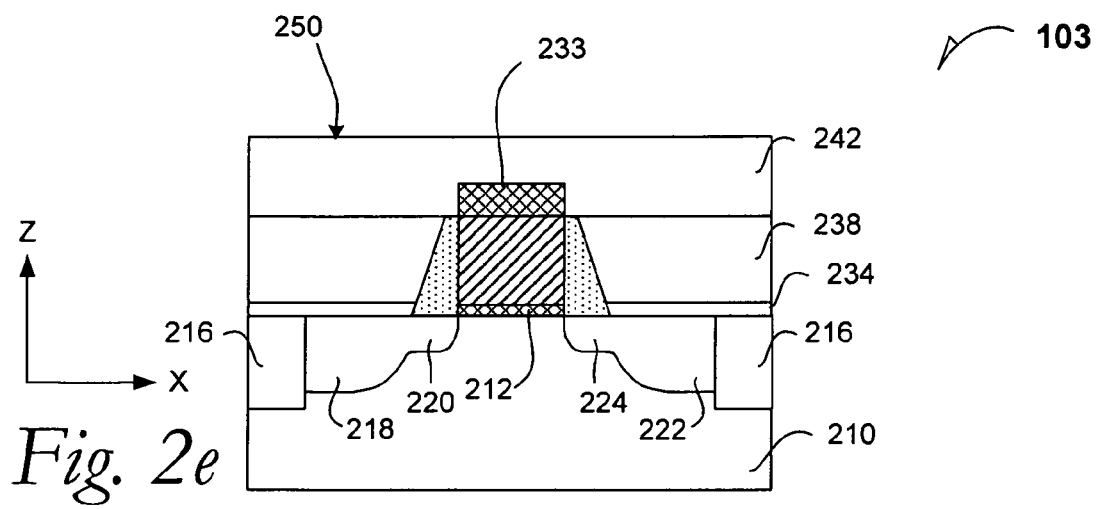
FIG. 2e is a cross-section elevation of the microelectronic device depicted in FIG. 2d after further processing according to an embodiment.

FIG. 2e is a cross-section elevation of the microelectronic device depicted in FIG. 2d after further processing according to an embodiment. The microelectronic device 205 has been blanket deposited with an ILD cap layer 242 which has an ILD cap layer upper surface 250. Consequently, the upper surface 240 has been obscured on the ILD first layer 238. The ILD cap layer 242 depicted in FIG. 2e is the ILD cap layer 243 depicted in FIG. 2 before a penetrating etch.

Figure 2F:
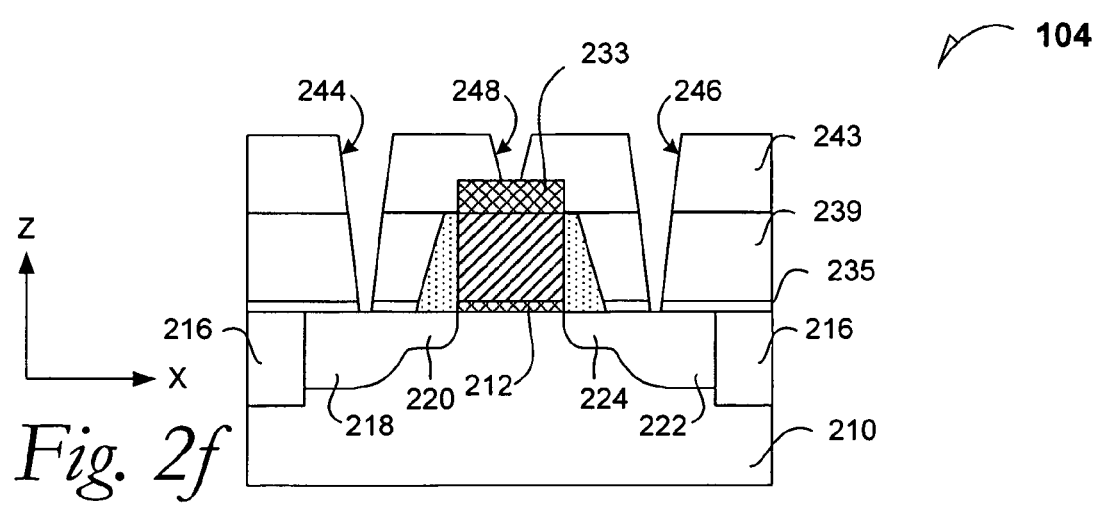
FIG. 2f is a cross-section elevation of the microelectronic device depicted in FIG. 2e after further processing according to an embodiment.

FIG. 2f is a cross-section elevation of the microelectronic device depicted in FIG. 2e after further processing according to an embodiment. The microelectronic device 206 has been processed with a directional etch through a mask (not pictured) to form recesses in the several layers. A source contact via 244 has penetrated the ILD cap layer 242 to make it a penetrated ILD cap layer 243, the ILD first layer 238 to make it a penetrated ILD first layer 239, and the NESL 234 to make it a penetrated NESL 235. The directional etch has also formed a drain contact via 246 with similar results. The directional etch has also formed a gate electrode contact partial via 248 that has stopped on the converted amorphous silicon etch stop layer 233 according to an embodiment.

In an embodiment, the directional etch is prepared such that etching stops both on the semiconductive body 210 through the penetrated ILD cap layer 243, the penetrated ILD first layer 239, and the penetrated NESL 235, and the directional etch stops on the gate electrode 214 as well by penetrating the converted amorphous silicon etch stop layer 233. This will be described further.

Figure 2G:
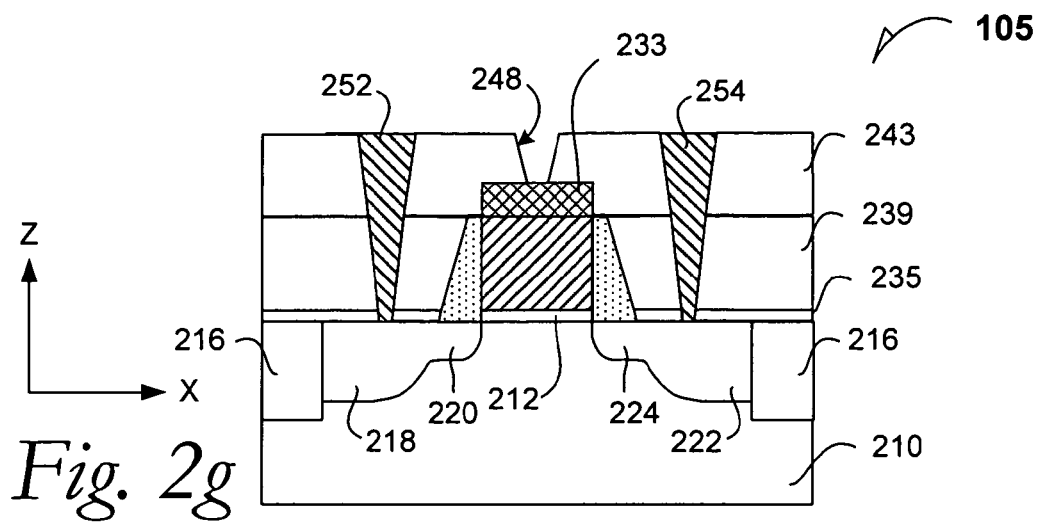
FIG. 2g is a cross-section elevation of the microelectronic device depicted in FIG. 2f after further processing according to an embodiment.

FIG. 2g is a cross-section elevation of the microelectronic device depicted in FIG. 2f after further processing according to an embodiment. The microelectronic device 207 has been processed to fill source- and drain contacts 252 and 254, respectively into the respective source contact via 244 and drain contact via 246. By leaving the gate electrode contact partial via 248 unfilled, the process may require masking thereof.

Figure 2H:
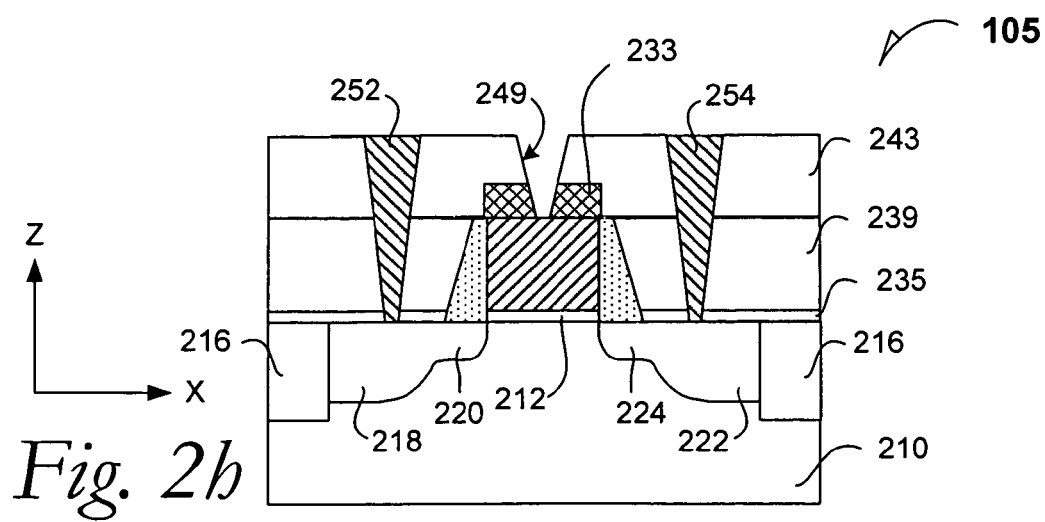
FIG. 2h is a cross-section elevation of the microelectronic device depicted in FIG. 2g after further processing according to an embodiment.

FIG. 2h is a cross-section elevation of the microelectronic device depicted in FIG. 2g after further processing according to an embodiment. The microelectronic device 208 has been processed with a second directional etch that is self-aligning to the gate electrode contact partial via 248 depicted in FIG. 2g. As a consequence, the gate electrode contact via 249 has been formed that has stopped on the gate electrode 214.

As discussed previously, a single directional etch may simultaneously form the gate electrode contact via 249 to stop on the gate electrode 214 as well as the respective source contact via 244 and drain contact via 246 that stop on the semiconductive body 210. The single direction etch may be prepared by adjusting both the etch resistivities and the thicknesses of the NESL 234 and the converted amorphous silicon etch stop layer 233 such that after the respective source- and drain contact vias 244 and 246 have reached the NESL 234, etching through the ILD cap layer 238 and the converted amorphous silicon etch stop layer 233 are completed at about the same time the NESL 234 has been breached.

As discussed previously, two back-to-back directional etches may form the gate electrode contact via 249 to stop on the gate electrode 214 as well as the respective source contact via 244 and drain contact via 246 that stop on the semiconductive body 210. The back-to-back directional etches may be done by first etching and stopping on the semiconductive body 210 in the respective source contact via 244 and drain contact via 246, followed by second etching that forms the gate electrode contact via 249 to stop on the gate electrode 214. This second etching is selective to leaving the semiconductive material of the semiconductive body 210. In an embodiment, back-to-back etches may be done in the reverse order, i.e., the gate electrode contact via 249 is first formed in a first etch, and the respective source contact via 244 and drain contact via 246 are formed in a second etch that is selective to leaving the metal of the gate electrode 214.

Reference is again made to FIG. 2. The microelectronic device 200 has been thus far fabricated by a partially selective deposition—or a selective deposition and conversion of an amorphous silicon etch stop layer 233.

Figure 3:
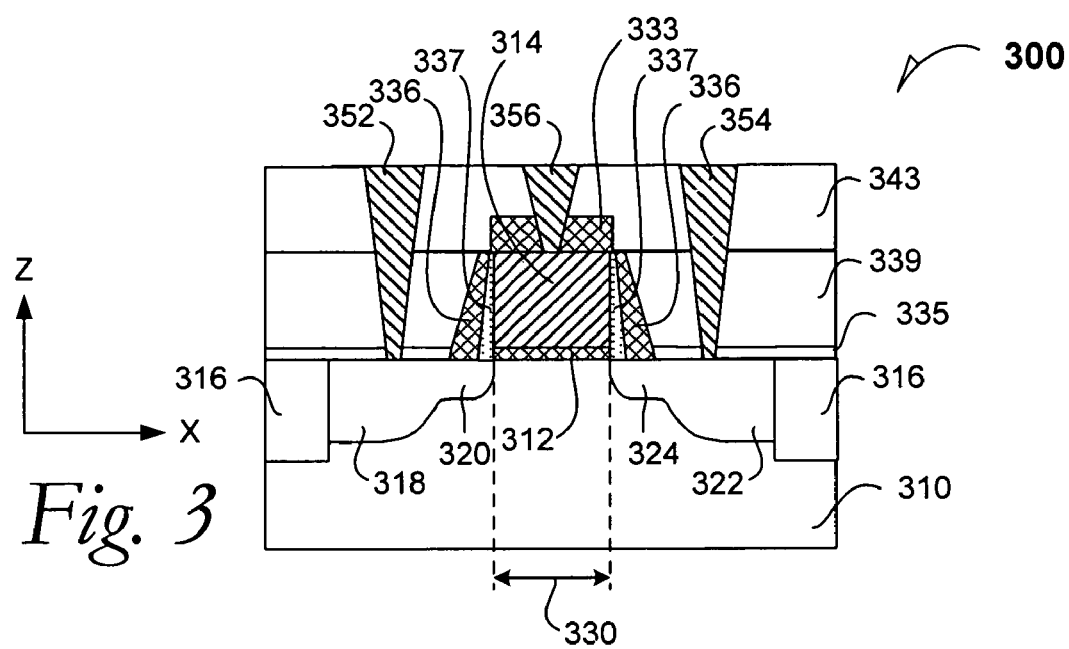
FIG. 3 is a cross-section elevation of a microelectronic device with a selectively deposited and converted amorphous silicon etch stop layer above a metal gate according to an embodiment.

FIG. 3 is a cross-section elevation of a microelectronic device 300 with a selectively deposited and converted amorphous silicon etch stop layer 333 above a metal gate 314 according to an embodiment. As depicted, the microelectronic device 300 illustrates a transistor. The transistor includes a semiconductive body 310 with a gate dielectric 312 disposed upon an upper surface thereof. A gate electrode 314 is disposed on the gate dielectric 312. In an embodiment, the semiconductive body 310 includes an SOI structure. In an embodiment, the semiconductive body 310 is a fin-shaped prominence that extends from a larger substrate of semiconductive material. Other embodiments for semiconductive material for the semiconductive body 310 may use combined semiconductors, for example, indium phosphide, gallium arsenide, gallium nitride, silicon germanium, and silicon carbide.

In an embodiment, the semiconductive body 310 comprises any material, e.g., SOI, gallium arsenide (GaAs), germanium (Ge), SiGe, and the like. In an embodiment, the semiconductive body 310 includes one or more metallization layers of integrated circuits having active and passive devices, such as transistors, switches, optoelectronic devices, capacitors, resistors, and interconnects. The one or more metallization layers of integrated circuits are separated from adjacent metallization layers by dielectric material such as ILD layers.

In an embodiment, the transistor is isolated by structures such as an STI 316. The gate electrode 314 is formed on the gate dielectric 312 and may be a metal gate that is any combination of the given metals.

FIG. 3 also illustrates the transistor with a source region 318 that includes a shallow source extension region tip 320 embodiment and a drain region 322 that includes a shallow drain tip 224 embodiment that are formed at the opposite sides of the gate electrode 314. In an embodiment, the width 330 of the channel zone under the gate dielectric 312 between the tip 320 embodiment and the tip 324 embodiment is in the range of 9 nm to 120 nm. This width 330 may be mapped to the gate width 130 depicted in the computer rendition of the photomicrograph 100 depicted in FIG. 1.

In an embodiment, the source region 318 and the drain region 322 may be formed using one of techniques known to one of ordinary skill in the art of microelectronic device manufacturing. In an embodiment, dopants are first implanted into the substrate 310 at the opposite sides of the gate electrode 314 to form the respective tips 320 and 324. As a result the gate electrode 314 serves as a hard mask to prevent implantation of dopants into the portions of the semiconductive body 310 below the gate dielectric 312 that defines the channel zone of the transistor. In an embodiment, to form an n-MOS transistor, the dopants are n-type dopants, for example, arsenic ions or phosphorus ions with the concentration in the range of $10^{18}$ cm$^{-3}$ to $10^{21}$ cm$^{-3}$. In an embodiment, to form a p-MOS transistor structure, the dopants are p-type dopants, for example, boron ions having the concentration in the range of $10^{18}$ cm$^{-3}$ to $10^{21}$ cm$^{-3}$.

An NESL 335 is disposed across the upper surface of the semiconductive body 310. Inner spacers 337 and outer spacers 336 are formed on the semiconductive body 310. The inner spacers 337 are adjacent to sidewalls of the gate electrode 314 and the outer spacers 336 are adjacent to the inner spacers 337. In an embodiment, the inner spacers 337 cover sidewalls of the gate electrode 314 and part of the upper surface of the semiconductive body 310 at opposite sides of the gate electrode 314.

In an embodiment, the inner spacers 337 are a different material from the outer spacers 336.

The gate electrode 314 is depicted disposed within an ILD first layer 339, and an ILD cap layer 343 is disposed above the ILD first layer 339. A source contact 352 and a drain contact 354 make contact with the upper surface of the semiconductive body 310 by penetrating the ILD first layer 339, the ILD cap layer 343, and the NESL 335.

A gate contact 356 is disposed in the ILD cap layer 343 and it penetrates the converted amorphous silicon layer 333.

Figure 4:
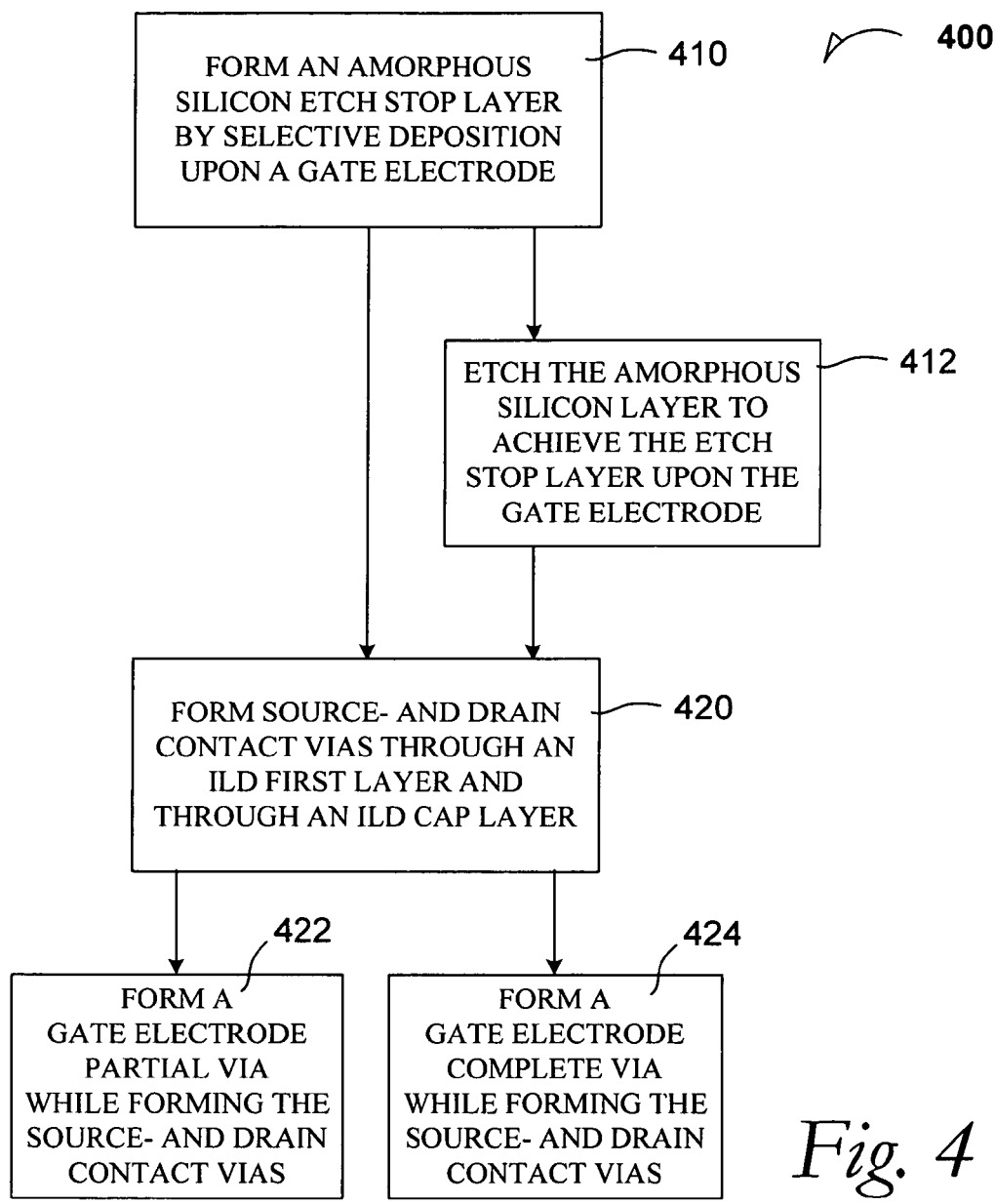
FIG. 4 is a process flow diagram according to an embodiment.

FIG. 4 is a process flow diagram 400 according to an embodiment.

At 410, the process includes forming an amorphous silicon etch stop layer by a selective deposition upon a metal gate electrode that is disposed in an ILD first layer. In a non-limiting example embodiment, this process includes forming a selective deposition or it may include a partially selective deposition.

At 412, the process includes etching the amorphous silicon etch stop layer to remove any amorphous silicon that is not in contact with metal gate electrode material. In a non-limiting example embodiment, this process includes forming a partially selective deposition, followed by the etching.

At 420, the process includes forming source- and drain contact vias through the ILD first layer and through an ILD cap layer.

At 422, the process includes forming a gate electrode contact partial via while forming the source- and drain contact vias.

At 424, the process includes forming a gate electrode contact complete via simultaneously with forming the source- and drain contact vias.

Figure 5:
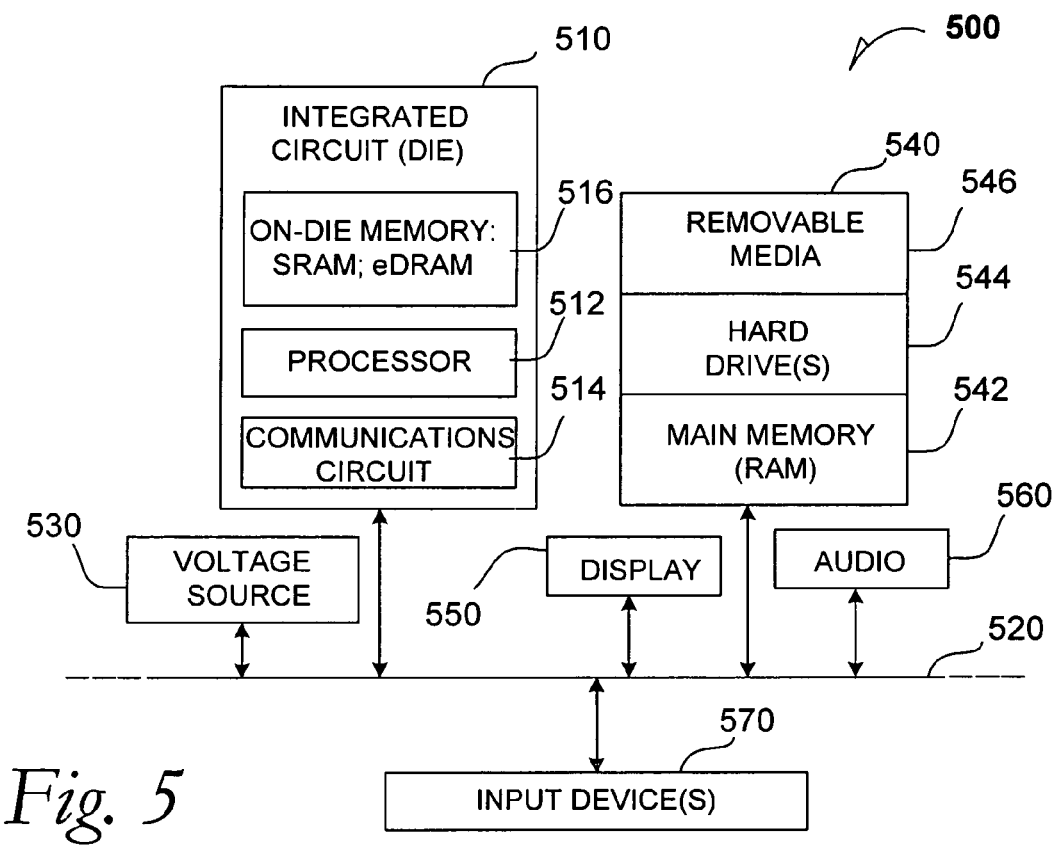
FIG. 5 is a schematic of an electronic system according to an embodiment.

FIG. 5 is a schematic of an electronic system 500 according to an embodiment. The electronic system 500 as depicted can embody a die with a transistor that includes a selectively deposited etch stop layer above a metal gate electrode as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an application-specific integrated circuit (ASIC), such as a communications circuit 514 for use in wireless devices such as cellular telephones, pagers, portable computers, two-way radios, and similar electronic systems. In an embodiment, the processor 510 includes on-die memory 516 such as static random-access memory (SRAM). In an embodiment, the processor 510 includes on-die memory 516 such as embedded dynamic random-access memory (eDRAM).

In an embodiment, the electronic system 500 also includes an external memory 840 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including a transistor that includes a selectively deposited etch stop layer above a metal gate electrode, an electronic system, a computer system, one or more methods of fabricating an integrated circuit, and one or more methods of fabricating an electronic assembly that includes a transistor that includes a selectively deposited etch stop layer above a metal gate electrode as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming an amorphous silicon film upon a substrate, the substrate including: a gate electrode disposed above a semiconductive body, including a gate electrode upper surface and at lease one sidewall;
   a nitride etch stop layer (NESL) disposed above and on the semiconductive body;
   a spacer disposed on the at least one sidewall; and
   an interlayer dielectric (ILD) first layer including an ILD first layer upper surface, wherein the gate electrode upper surface and the ILD first layer upper surface are substantially coplanar, wherein forming the amorphous silicon film is carried out under conditions to accumulate on the metal gate upper surface and not on the ILD first layer upper surface; and
   forming an etch stop layer from the amorphous silicon film.

2. The process of claim 1, wherein accumulation of the amorphous silicon film is achieved by selectively etching back the amorphous silicon film to remove amorphous silicon disposed upon the ILD first layer upper.

3. The process of claim 1, further including:
   forming an ILD cap layer over the ILD first layer;
   etching source- and drain contact vias through the ILD cap layer, the ILD first layer, and the NESL; and
   etching a gate electrode partial via through the ILD cap layer that stops on the etch stop layer.

4. The process of claim 1, further including:
   forming an ILD cap layer over the ILD first layer;
   etching source- and drain contact vias through the ILD cap layer, the ILD first layer, and the NESL; and
   simultaneously etching a gate electrode complete via through the ILD cap layer that stops on the amorphous silicon film.

5. The process of claim 1, further including converting the amorphous silicon to a dielectric material under nitriding conditions to achieve silicon nitride.

6. The process of claim 1, further including converting the amorphous silicon to a dielectric material under oxidizing conditions to achieve silicon oxide.

7. The process of claim 1, further including converting the amorphous silicon to a dielectric material under carburizing conditions to achieve silicon carbide.

8. The process of claim 1, further including converting the amorphous silicon to a dielectric material under conditions to achieve silicon oxynitride.

9. The process of claim 1, further including:
   forming an ILD cap layer over the ILD first layer;
   etching source- and drain contact vias through the ILD cap layer, the ILD first layer, and the NESL; followed by
   etching a gate electrode complete via through the ILD cap layer that stops on the gate electrode.

10. The process of claim 1, further including:
    forming an ILD cap layer over the ILD first layer;
    etching a gate electrode complete via through the ILD cap layer that stops on the gate electrode; followed by
    etching source- and drain contact vias through the ILD cap layer, the ILD first layer, and the NESL.

11. The process of claim 1, wherein forming the amorphous silicon film upon the substrate includes getting the amorphous silicon to accumulate on the metal gate upper surface and not on the ILD first layer upper surface.

12. A process comprising:
    forming an amorphous silicon film upon a substrate,
    the substrate including:
        a gate electrode disposed above a semiconductive body, including a gate electrode upper surface and at lease one sidewall;
        a nitride etch stop layer (NESL) disposed above and on the semiconductive body;
        a spacer disposed on the at least one sidewall; and
        an interlayer dielectric (ILD) first layer including an ILD first layer upper surface, wherein the gate electrode upper surface and the ILD first layer upper surface are substantially coplanar,
    wherein forming the amorphous silicon film is carried out under conditions of getting the amorphous silicon to accumulate on the metal gate upper surface and not on the ILD first layer upper surface.

13. The process of claim 12, wherein getting the amorphous silicon to accumulate on the metal gate upper surface and not on the ILD first layer upper surface includes:
    depositing using at least one of silane ($SiH_4$) and disilane ($Si2H6$) at a temperature between 250-400 degrees Celsius, at a pressure of 0.1-10 Torr, for a time duration of 1-30 seconds, and with RF power of 10-3,000 Watt.

14. The process of claim 12, wherein the spacer is an inner spacer adjacent the gate electrode, the substrate further including an outer spacer adjacent the inner spacer, the process further including:
    forming an etch stop layer from the amorphous silicon film.

15. The process of claim 12, wherein getting the amorphous silicon to accumulate on the metal gate upper surface and not on the ILD first layer upper surface includes:
    depositing using at least one of silane ($SiH_4$) and disilane ($Si2H6$) at a temperature between 250-400 degrees Celsius, at a pressure of 0.1-10 Torr, for a time duration of 1-30 seconds, and with RF power of 10-3,000 Watt, and the process further including:
    forming an etch stop layer from the amorphous silicon film.

16. The process of claim 12, further including:
    forming an ILD cap layer over the ILD first layer;
    etching source- and drain contact vias through the ILD cap layer, the ILD first layer, and the NESL; and
    etching a gate electrode partial via through the ILD cap layer that stops on the etch stop layer.

17. The process of claim 12, further including:
    forming an ILD cap layer over the ILD first layer;
    etching source- and drain contact vias through the ILD cap layer, the ILD first layer, and the NESL; and
    simultaneously etching a gate electrode complete via through the ILD cap layer that stops on the amorphous silicon film.

18. The process of claim 12, further including converting the amorphous silicon to a dielectric material under nitriding conditions to achieve silicon nitride.

19. The process of claim 12, further including converting the amorphous silicon to a dielectric material under oxidizing conditions to achieve silicon oxide.

20. The process of claim 12, further including converting the amorphous silicon to a dielectric material under carburizing conditions to achieve silicon carbide.

21. The process of claim 12, further including converting the amorphous silicon to a dielectric material under conditions to achieve silicon oxynitride.

22. The process of claim 12, further including:
forming an ILD cap layer over the ILD first layer;
etching source- and drain contact vias through the ILD cap layer, the ILD first layer, and the NESL; followed by
etching a gate electrode complete via through the ILD cap layer that stops on the gate electrode.

23. A process comprising:
forming an amorphous silicon film upon a substrate,
the substrate including:
   a gate electrode disposed above a semiconductive body, including a gate electrode upper surface and at lease one sidewall;
   a nitride etch stop layer (NESL) disposed above and on the semiconductive body;
   a spacer disposed on the at least one sidewall; and
   an interlayer dielectric (ILD) first layer including an ILD first layer upper surface, wherein the gate electrode upper surface and the ILD first layer upper surface are substantially coplanar,
wherein forming the amorphous silicon film is carried out under conditions of getting the amorphous silicon to accumulate on the metal gate upper surface and not on the ILD first layer upper surface, the conditions including:
   depositing using at least one of silane ($SiH_4$) and disilane (Si2H6) at a temperature between 250-400 degrees Celsius, at a pressure of 0.1-10 Torr, for a time duration of 1-30 seconds, and with RF power of 10-3,000 Watt;
forming an etch stop layer from the amorphous silicon film;
forming an ILD cap layer over the ILD first layer;
etching source- and drain contact vias through the ILD cap layer, the ILD first layer, and the NESL; and
etching a gate electrode via through the ILD cap layer that stops on the etch stop layer.

24. The process of claim 23, wherein etching a gate electrode via includes etching a partial via that stops on the etch stop layer that was formed from the amorphous silicon layer.

25. The process of claim 23, wherein etching a gate electrode via includes etching and stopping on the gate electrode while simultaneously etching source- and drain vias.

* * * * *